United States Patent [19]
Zhou et al.

[11] Patent Number: 5,965,871
[45] Date of Patent: Oct. 12, 1999

[54] COLUMN READOUT MULTIPLEXER FOR CMOS IMAGE SENSORS WITH MULTIPLE READOUT AND FIXED PATTERN NOISE CANCELLATION

[75] Inventors: Zhimin Zhou, Santa Clara; Zhongxuan Zhang, Fremont; Li-yen Shih, Danville; Wei Li, Fremont, all of Calif.

[73] Assignee: PixArt Technology, inc., Fremont, Calif.

[21] Appl. No.: 08/964,924

[22] Filed: Nov. 5, 1997

[51] Int. Cl.[6] .............................. G11C 19/28; H01L 27/14; H01L 27/02
[52] U.S. Cl. .......................... 250/208.1; 257/294; 327/94
[58] Field of Search ................ 250/208.1; 257/292–294; 327/91, 94, 514; 377/60

[56] References Cited

U.S. PATENT DOCUMENTS

| | | | |
|---|---|---|---|
| 4,683,580 | 7/1987 | Matsunaga | 377/60 |
| 5,192,990 | 3/1993 | Stevens | 377/60 |
| 5,323,052 | 6/1994 | Koyama | 257/294 |
| 5,471,515 | 11/1995 | Fossum et al. | 377/60 |
| 5,576,763 | 11/1996 | Ackland et al. | 348/308 |

OTHER PUBLICATIONS

Zhou et al., "A CMOS Active Pixel Image Sensor With Amplification And Reduced Fixed Pattern Noise", IEEE Workshop on Charge–Coupled Devices and Advanced Image Sensors, (Apr. 1995) 5 pgs.

Mendis et al., "CMOS Active Pixel Image Sensors For Highly Integrated Imaging Systems", *IEEE Journal of Solid–State Circuits*, vol. 32, No. 2 (Feb. 1997) pp. 187–197.

*Primary Examiner*—Stephone Allen
*Attorney, Agent, or Firm*—Claude A. S. Hamrick; Oppenheimer W. Donnelly; Justin Boyce

[57] ABSTRACT

An active pixel sensing structure includes an array of pixel unit cells each of which an adapted to alternate between a light sensing mode wherein the cell outputs an image signal and a reset mode wherein the cell outputs a reset signal. The image signal is proportional to light incident on the cell, and the reset signal is proportional to a predefined reference potential. An improved readout circuit according to the present invention includes a first sample and hold component for receiving and storing the image signal, and second sample and hold component for receiving and storing the reset signal. A signal amplifier is provided for each sample and hold component. A switching circuit is operable between a first mode and a second mode. In the second mode, the first and second sample and hold components are operatively decoupled from the corresponding signal amplifiers while input terminals of the signal amplifiers are connected to a source of predetermined reference potential. With the switching circuit in the second mode, fixed pattern noise (FPN) attributable to the amplifiers is determined. With the switching means in the first mode, a voltage, D2, is determined across outputs of the signal amplifiers. The voltage, D2, is proportional to a voltage equal to the difference between the image signal and the reset signal plus the FPN voltage. A processing means subtracts the voltage, D1, from the voltage, D2, to develop a signal proportional to the light detected by the cell.

18 Claims, 8 Drawing Sheets

5,965,871

COLUMN READOUT MULTIPLEXER FOR CMOS IMAGE SENSORS WITH MULTIPLE READOUT AND FIXED PATTERN NOISE CANCELLATION

BACKGROUND OF THE INVENTION

1. Field of the Invention

The present invention relates generally to semiconductor imaging devices. Specifically, the present invention relates to a method and apparatus which enables multiple nondestructive read out of signals generated by an image sensor wherein fixed pattern noise is canceled out.

2. Description of the Prior Art

Active pixel image sensing (APS) systems typically include an array of active pixel unit cells each of which includes a semiconductor image sensing device and active electronic components. Charge coupled devices (CCD's), photodiodes, and charge injection devices are examples of semiconductor image sensing devices used in APS systems. APS systems also include electronic circuits for reading image signals generated by the pixel unit cells.

Problems associated with semiconductor image sensing devices include charge transfer efficiency and destructive signal readout. Recent developments in APS technology attempting to address these problems include active pixel image sensing circuit devices fabricated using semiconductor processes which maximize charge transfer efficiency and which are compatible with complementary metal oxide semiconductor (CMOS) technology. CMOS compatible APS technology is suitable for applications including video phones, home surveillance devices, robotics and machine vision, guidance, navigation, and computer inputs.

Fossum et al. (U.S. Pat. No. 5,471,515) describes a CMOS active pixel image sensing device. For purposes of disclosure, Fossum et al. is incorporated herein by reference and describes devices in which each pixel unit cell of an array includes an image sensing device and three transistors for readout, selection, and reset. A column parallel readout architecture is employed to read out images one row at a time from the array. Circuitry is provided in each column for correlated double sampling (CDS) and fixed pattern noise (FPN) suppression.

Each pixel unit cell includes an imaging structure, a reset transistor, an in-pixel source follower, and a row selection transistor. The imaging structure includes a photogate with a floating diffusion output separated by a transfer gate. A readout circuit, which is provided for each column of pixels, includes a load transistor of a first source follower and two sample and hold circuits for storing a signal level and a reset level. Each sample and hold circuit includes a switch, a capacitor for storing charge representative of the sampled level, a column source follower, and a column selection transistor to buffer the capacitor voltages. Correlated double sampling (CDS) is achieved by sampling both a reset reference level and a signal level. The difference between the signal level and the reset reference level represents the net signal induced by illumination of the imaging structure.

During a signal integration period, photo-generated electrons are collected under the photo-gate of the imaging structure. After signal integration, an entire row of pixels is read out simultaneously using a plurality of readout circuits. The output of each pixel is sampled onto a reset capacitor in the readout circuit at the bottom of the column by enabling the sample and hold switch corresponding to the reset capacitor. The photogate of the pixel unit cell is pulsed low to transfer the signal charge to a floating diffusion node. The new output voltage of the pixel unit cell is then sampled onto the signal level capacitor at the bottom of the column by enabling the sample and hold switch corresponding to the signal level capacitor. The stored reset and signal levels are sequentially scanned out through the column source followers by enabling column address switches.

Fossum et al. further describes a method and apparatus for suppressing fixed pattern noise (FPN) in the above described circuit. FPN may limit performance of an image sensor and is attributed mainly to threshold voltage variations between adjacent source-follower transistors in the readout circuits. A crowbar switch and two column select switches on either side of the crowbar switch are used to selectively provide a short circuit between the two sample and hold capacitors. These switches enable delta difference sampling (DDS) wherein the reset and signal levels stored in each column are read differentially as described above. Subsequently, the crow bar switch is pulsed to short the two sample and hold capacitors in the column that is being addressed. The outputs of the reset and signal branches are then again read out differentially. Accordingly, a voltage and signal are generated which are proportional to the threshold voltage difference between the source follower transistors. This reference level is then subtracted from the previous reading, and the offset due to threshold voltage variations is removed.

As mentioned, in the readout circuit described by Fossum et al, the crowbar switch selectively provides a short circuit between the two sample and hold capacitors after measuring the difference between the charge levels stored in each capacitor. The shorting of these two capacitors causes charge sharing wherein charge flows from the capacitor having a higher potential to the capacitor having a lower potential. Therefore, the original stored charge level in each capacitor is changed by activating the crowbar switch. As a result, it is not feasible to obtain more than one measurement of the charge levels stored in the capacitors. This presents a problem because a single measurement may be inaccurate. It would be more advantageous to be able to make multiple measurements of the charge levels stored in the capacitors. Multiple measurements would allow for statistical analysis, including averaging and interpolation, of the multiple measurements to arrive at more accurate determinations of image information. Multiple measurements would also provide advantages for purposes of motion detection and predictive coding processing for video applications.

SUMMARY OF THE INVENTION

It is therefore an object of the present invention to provide an improved readout circuit having sample and hold capacitors wherein charge sharing does not occur between the capacitors.

It is also an object of the present invention to provide a readout circuit having sample and hold capacitors for an image signal and a reset signal wherein it is possible to make multiple nondestructive measurements of the difference between charge levels stored in each capacitor.

Briefly, a presently preferred embodiment of the present invention includes an active pixel sensing structure formed of an array of pixel unit cells each of which is adapted to alternate between a light sensing mode wherein the cell outputs an image signal and a reset mode wherein the cell outputs a reset signal. The image signal is proportional to light incident on the cell and the reset signal is proportional to a predefined reference potential. The structure further includes improved readout circuits for reading out signals from each cell. The improved readout circuits each include a first sample and hold means for receiving and storing the image signal, a second sample and hold means for receiving and storing the reset signal, a first signal amplifying means having a first input terminal and a first output terminal. A second signal amplifying means has a second input terminal and a second output terminal. The circuits further include a switching means operable between a first mode and a second mode. In the first mode, the first sample and hold means is connected to the first input terminal, and the second sample and hold means is connected to the second input terminal. In the second mode, the first sample and hold means is operatively decoupled from the first input terminal, the second sample and hold means is operatively decoupled from the second input terminal, and the first and second input terminals of the signal amplifying means are connected to a predefined reference potential.

With the switching means in the second mode, a voltage, D1, determined across the first and second output terminals, is proportional to a fixed pattern noise (FPN) voltage attributable to the first and second amplifying means. With the switching means in the first mode, a voltage, D2, determined across the first and second output terminals is proportional to a voltage equal to the difference between the image signal and the reset signal plus the FPN voltage. A signal output processing means subtracts the voltage, D1, from the voltage, D2, to develop a signal proportional to the light detected by the corresponding cell. With the switching means in the second mode, the first sample and hold means is operatively decoupled from the first signal amplifying means and the second sample and hold means is operatively decoupled from the second signal amplifying means. This operative decoupling prevents charge sharing between the first and second sample and hold means while the FPN voltage is determined. Therefore, the relative amounts of charge stored in the first and second sample and hold capacitors is maintained.

An advantage of the present invention is that it allows for multiple nondestructive readout measurements of signals proportional to the light detected by the cell.

Another advantage of the present invention is that it permits multiple nondestructive measurements which allow for statistical analysis, including averaging and interpolation, of the measurements so that more accurate determinations of image information can be obtained.

Other objects and advantages of the present invention will become apparent to those skilled in the art after having read the following detailed description of the preferred embodiments illustrated in the several figures of the drawing.

IN THE DRAWINGS

DETAILED DESCRIPTION OF THE PREFERRED EMBODIMENTS

Figure 1:
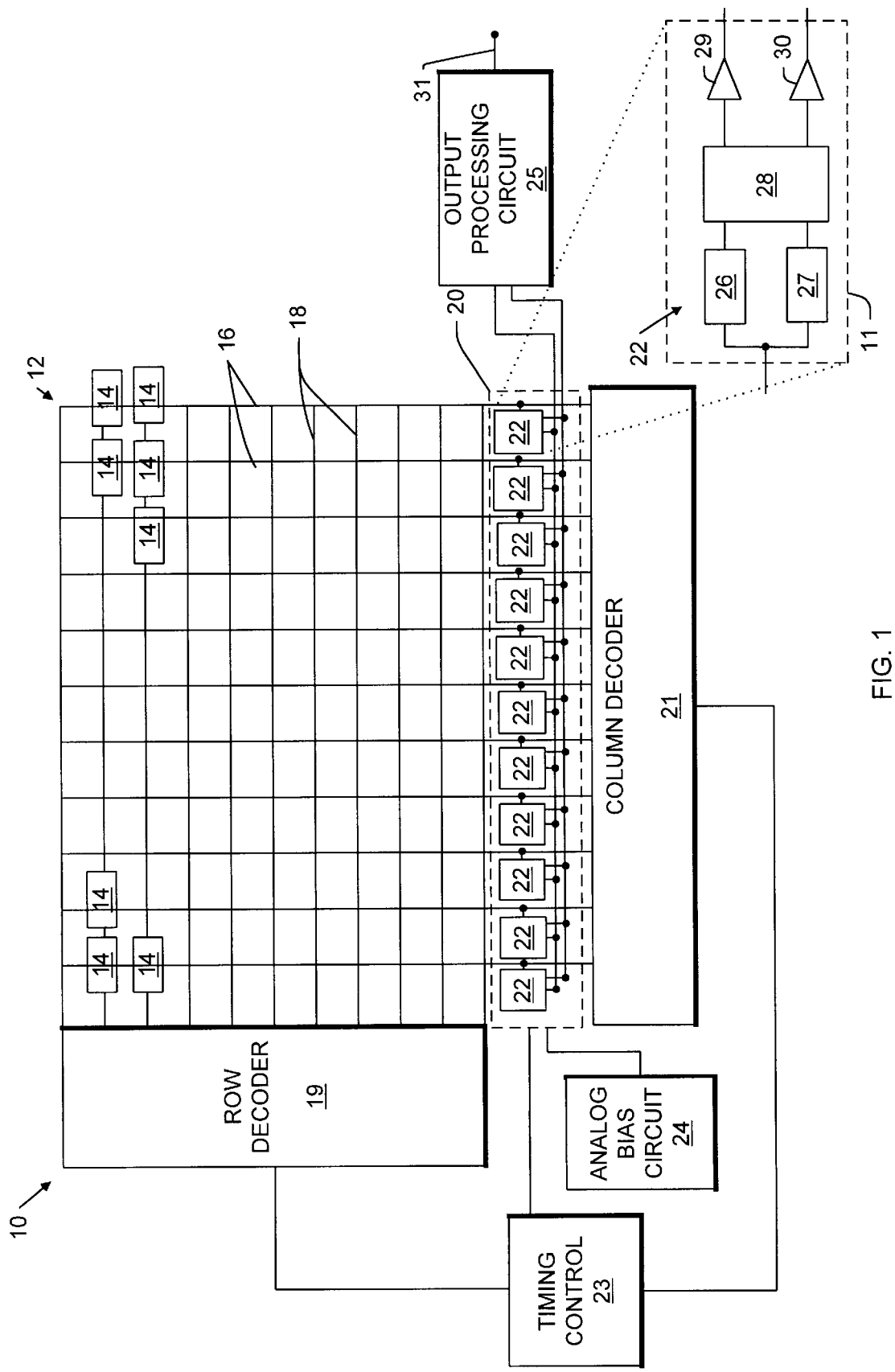
FIG. 1 is a schematic block diagram of an active pixel sensing structure including a readout circuit according to principles of the present invention.

Referring now to the drawing, FIG. 1 shows a generalized schematic block diagram of an active pixel sensing (APS) structure 10 in accordance with principles of the present invention including an array 12 of pixel unit cells generally represented by the blocks 14, an integer number, m, of column buses or "bit lines" 16, an integer number, n, of row buses or "bit lines" 18, a row decoder 19, a column multiplexer 20 including a plurality of column readout circuits 22, and a column decoder 21.

Pixel unit cells 14 may be embodied, for example, as photo-diode-type APS cells or complementary metal oxide semiconductor (CMOS) APS cells of the type described in Fossum et al. (U.S. Pat. No. 5,471,515). Each of the cells 14 includes a row select switch (not shown) which is coupled to receive a row select signal from row decoder 19 In the described embodiment, column multiplexer 20 includes m readout circuits 22; one for each of the column buses 16. Each of the readout circuits 22 is coupled to receive data signals from one column of pixel unit cells 14 via a corresponding column bus 16. Each readout circuit includes a column select switch (not shown) which is coupled to receive a column select signal from column decoder 21. A timing control means 23 provides timing control signals to each of the readout circuits 22 of column multiplexer 20. Timing control means 23 also provides timing control signals to column decoder 21 and row decoder 19. An analog bias circuit 24 provides bias signals to each readout circuit 22.

In the preferred embodiment, each of the pixel unit cells 14 is adapted to alternate between a light sensing mode wherein the cell outputs an image signal, and a reset mode wherein the cell outputs a reset signal. The image signal is proportional to light incident on the cell, and the reset signal is proportional to a predefined reference potential externally applied to the cell. Data signals from each row of cells 14 are processed in parallel by readout circuits 22 and are output serially to an output signal processing circuit 25 which provides resultant data signals.

As further illustrated by the blown up block 11, each of readout circuits 22 includes an image signal sampling means 26 for receiving and storing image signals from cells 14, a reset signal sampling means 27 for receiving and storing the reset signals from cells 14, and dual mode switching means 28 for selectively coupling signals stored in sampling means 26 and 27 to an image signal amplifier 29 and a reset signal amplifier 30 respectively.

Switching means 28 is operable to alternate between an isolation mode and a coupling mode. In the coupling mode, sampling means 26 is coupled to amplifier 29, and sampling means 27 is coupled to reset signal amplifier 30. In the isolation mode, sampling means 26 is operatively decoupled from image signal amplifier 29 and sampling means 27 is operatively decoupled from amplifier 30, while the inputs to the amplifiers 29 and 30 are connected to a predefined reference potential. Since sampling means 26 and 27 are isolated from amplifiers 29 and 30 during the isolation mode, fixed pattern noise (FPN) related to amplifiers 29 and 30 can be determined while charge is conserved in the sampling means 26 and 27. This feature distinguishes the present invention from prior art such as that disclosed above wherein no such isolation is provided, and as a result charge is depleted during measurement of FPN.

While switching means 28 is in the isolation mode, a voltage measurement may be taken across the output terminals of amplifiers 29 and 30 by processing circuit 25. The measured voltage will be proportional to the FPN which is attributable to threshold voltage differences between amplifiers 29 and 30. On the other hand, while switching means 28 is in the coupling mode, a voltage taken across the output terminals of amplifiers 29 and 30 by processing circuit 25 will be proportional to the difference between the image signal and the reset signal plus the FPN voltage. Processing circuit 25 is operative to subtract the isolation mode signals from the coupling mode signals to develop output signals at 31 proportional to the light detected by pixel unit cells 14.

Figure 2:
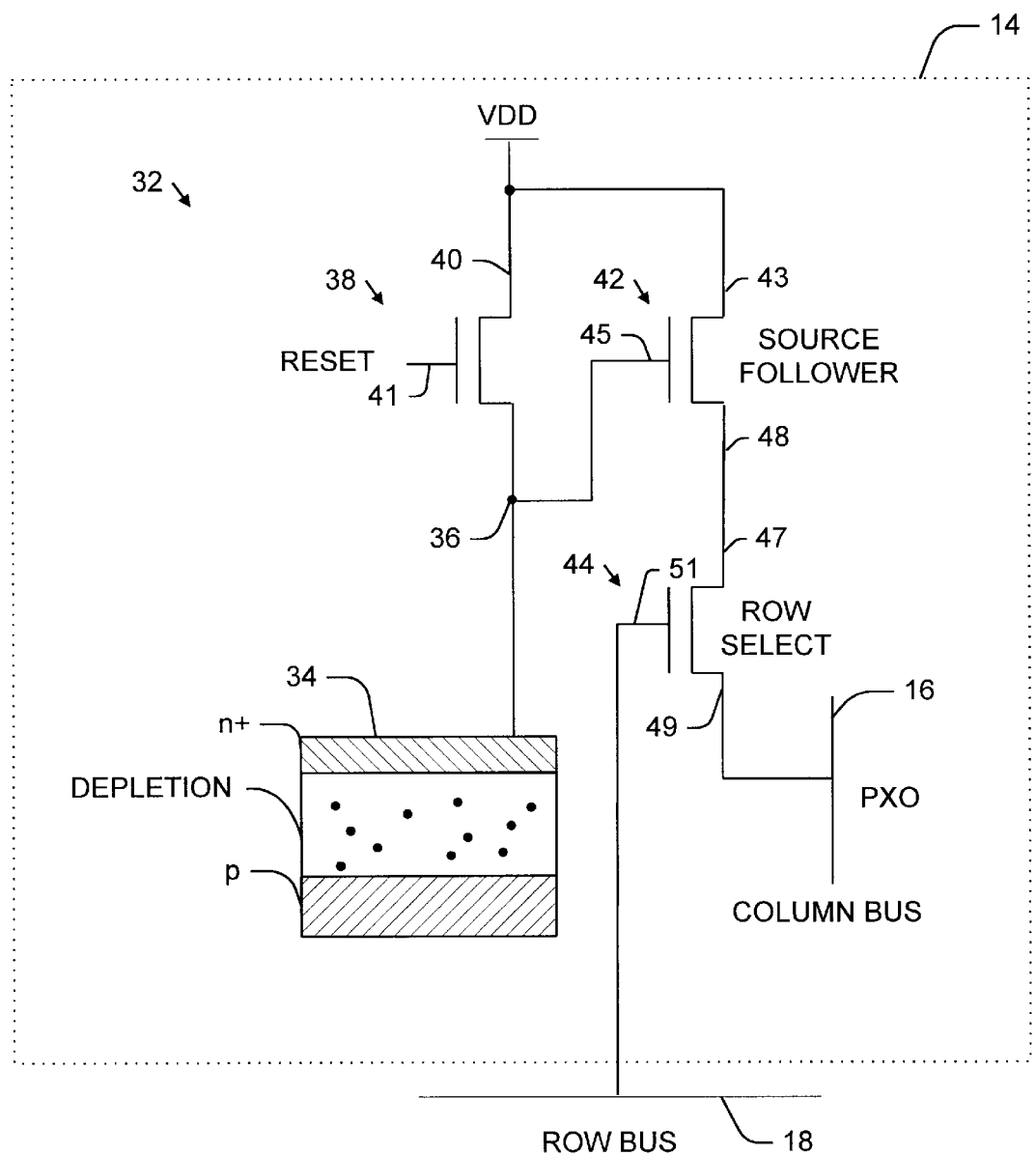
FIG. 2 is a schematic diagram illustrating a photo-diode-type active pixel cell of a type that may be included in the structure of FIG. 1.

FIG. 2 shows at 32 a schematic diagram depicting in general the components of a typical photo-diode-type active pixel unit cell 14. In an embodiment of the present invention, each of the pixel unit cells 14 of APS structure 10 (FIG. 1) may be implemented by cells of this type. The depicted cell includes: a p-n junction photo-diode 34 connected to a sensing node 36; a reset transistor 38 having its source 40 connected to a voltage source VDD and its drain connected to node 36; an in-pixel source follower transistor 42 having its source 43 connected to VDD and its gate 45 connected to node 36; and a row select transistor 44 having its source 47 connected to the drain 48 of transistor 42, its drain 49 connected to a column bus 16, and its gate 51 connected to a row bus 18. P-n junction photo-diode 34 includes an n-type region and a p-type region separated by a depletion region.

When reset transistor 38 is turned ON by the application of a RESET signal to gate 41, sensing node 36 is clamped to VDD which exerts a reverse bias on photo-diode 34 to induce the depletion. While reverse biased, if photo-diode 34 is illuminated, minority carriers will diffuse into the depletion region causing electrical charge to be stored therein proportional to the light cast thereon. This stored charge represents the image information content of the pixel unit cell. Also, while reset transistor 38 is turned ON, gate 45 of transistor 42 is biased such that a reference potential is provided at the source 47 of row select transistor 44 via transistor 42. When transistor 44 is subsequently turned ON by the application of a row select signal to gate 51, column bus 16 will be pulled up to the reset reference level until transistor 44 is turned OFF.

After photo-diode 34 is illuminated for the duration of a predetermined integration period during which image related charge is accumulated in the diode, reset transistor 38 is turned OFF and the reverse bias on photo-diode 34 is removed. At this time, the charge stored in diode 34 causes the potential at node 36 to be proportional to the level of the stored charge and represents the image signal, i.e. the intensity of the light applied to photodiode 34. With reset transistor 38 turned OFF and row select transistor 44 subsequently turned ON, column bus 16 will be pulled to an image signal level PXO commensurate with the charge applied to the gate of source follower 42. Signals applied to column bus 16 are processed by a readout circuit 22 (FIG. 1) as described below.

Figure 3:
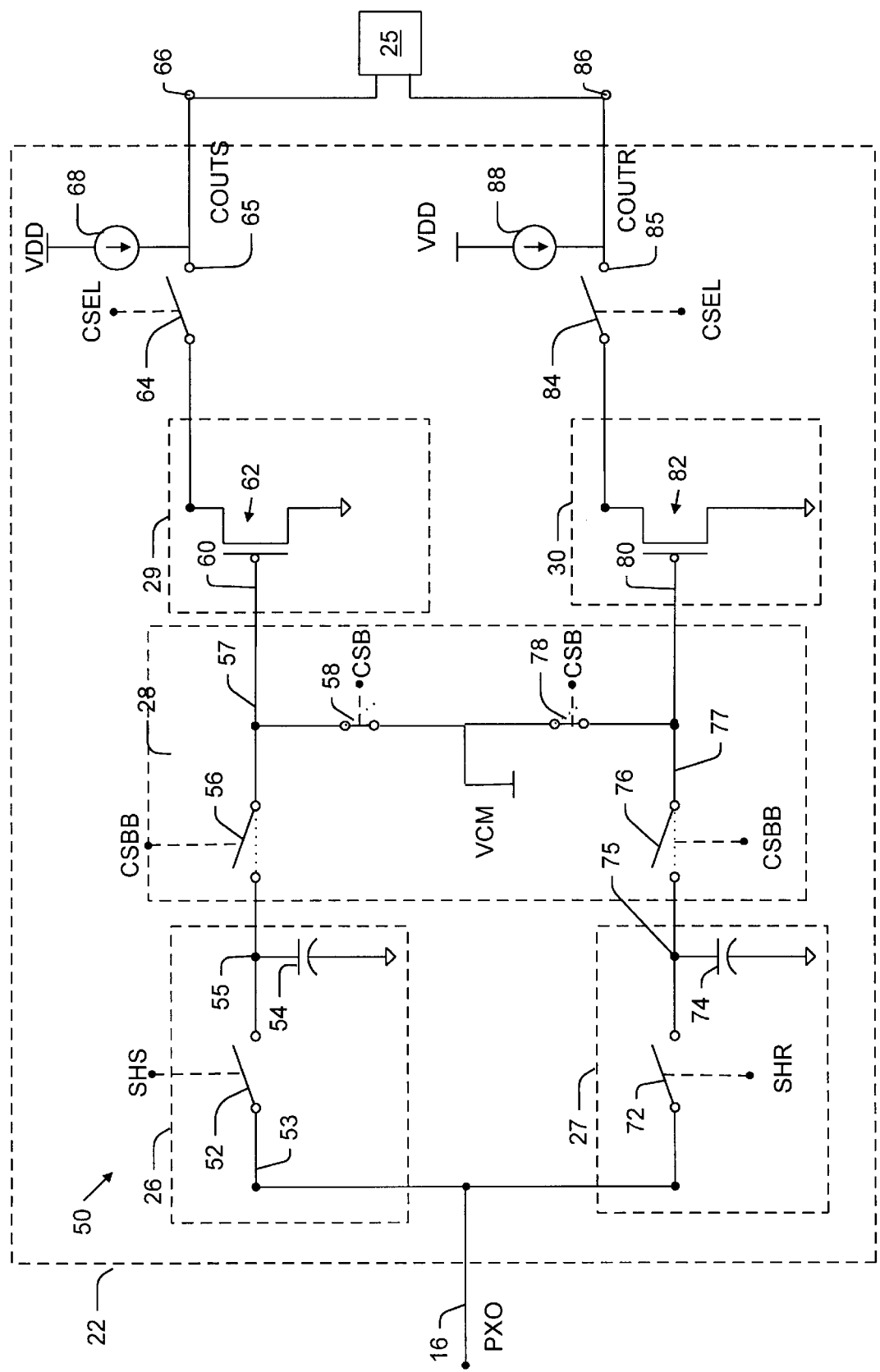
FIG. 3 is a schematic diagram depicting in general a readout circuit according to an embodiment of the present invention.

In FIG. 3, a schematic diagram is shown at 50 depicting the components of a readout circuit 22 according to an embodiment of the present invention. The dashed boxes 26–30 correspond to the like numbered components shown in FIG. 1. The depicted sample and hold circuit 26 circuit includes a switch 52 and capacitor 54, and has a first terminal 53 coupled to receive pixel output signal PXO from pixel unit cells 14 (FIG. 1) via a corresponding column bus 16. Switch 52 is responsive to an image control signal SHS generated by timing control circuit 23 (FIG. 1) and is operative when closed to cause the signal PXO to be stored in capacitor 54. With switch 52 open, the signal stored in the capacitor will be available at the output node 55.

The upper part of switching means 28 includes a first isolating switch 56 having a first terminal connected to node 55 and having a control input coupled to receive an isolation control signal CSBB from timing control circuit 23 (FIG. 1). A second terminal thereof is coupled to a circuit node 57 that is also connected to a first terminal of a first crowbar switch 58. A second terminal of switch 58 is coupled to a common mode voltage source VCM. Switch 58 is responsive to a crowbar control signal CSB generated by timing control circuit 23 (FIG. 1).

Node 57 is coupled to the gate 60 of a first source follower transistor 62 that implements the image amplifier 29 (FIG. 1) of readout circuit 22. Transistor 62 includes a drain coupled to ground and a source selectively coupled to an image output terminal by a first column select switch 64. An analog image output signal COUTS is developed at terminal 66 in response to closure of switch 64 by a column select signal CSEL generated by timing control circuit 23. A first current source 68 includes an input coupled to a voltage source VDD and an output coupled to output terminal 66. Current source 68 is normally included within analog bias circuit 24 (FIG. 1) and provides a bias current to each of the m readout circuits 22 of APS structure 10 (FIG. 1).

The depicted readout circuit further includes a second sample and hold circuit 27 having a reset switch 72 and a second capacitor 74. Circuit 27 is adapted to receive the reset reference signal from pixel unit cell 14 via column bus 16 (FIG. 1). Switch 72 includes a control input (not shown), coupled to receive a reset control signal SHR from the output of timing control means 23 (FIG. 1). A second terminal of switch 72 is coupled to a first side of reset capacitor 74 the opposite side of which is coupled to ground.

The lower portion of switching means 28 includes a second isolating switch 76 having a first terminal 75 coupled to capacitor 74, a control input (not shown) coupled to receive isolation control signal CSBB from timing control circuit 23 (FIG. 1), and a second terminal 77 coupled to one side of a second crowbar switch 78. The opposite side of switch 78 is coupled to VCM. A control input (not shown) to switch 78 coupled to receive crowbar control signal CSB from timing control circuit 23 (FIG. 1).

The second terminal 77 of second isolating switch 76 is also coupled to the gate 80 of a second source follower transistor 82 which implements reset amplifier 30 (FIG. 1) of readout circuit 22. Transistor 82 includes a drain coupled to ground and a source selectively coupled to a second output terminal 86 by a second column select switch 84. A second terminal 85 of switch 84 is also coupled to a second current source 88. Reset reference output terminal 86 provides an analog reset reference output signal COUTR. Current source 88 is likewise included within analog bias circuit 24 (FIG. 1) and provides a bias current to the reference output terminal 86 of each of the m readout circuits 22 in APS structure 10 (FIG. 1). A control input (not shown) to second column select switch 84 is coupled to receive the column select signal CSEL from the output of timing control circuit 23 (FIG. 1).

As may be understood from the above, switching means 28 is implemented by switches 56, 58, 76, and 78. With crowbar switches 58, 78 ON and isolating switches 56, 76 OFF (as indicated by the solid lines), switching means 28 is in an isolation mode wherein image signal sample and hold means 26 is isolated from gate 60 of first source follower transistor 62. Likewise, reset signal sample and hold means 27 is isolated from gate 80 of second source follower transistor 82. In this mode, the gates 60 and 80 are connected to VCM. With crowbar switches 58, 78 OFF and isolating switches 56, 76 ON (as indicated by the dashed lines), switching means 28 is in a coupling mode wherein capacitor 54 is connected to gate 60 and capacitor 74 is coupled to gate 80.

Switches 52, 56, 58, 64, 72, 76, 78, and 84 may be implemented using transistors or other types of switches. In the preferred embodiment, the switches are implemented using CMOS technology. The capacitors 54 and 74 may be implemented using a pair of metal or polysilicon plates or may as in the preferred embodiment be implemented between the gate and body of MOS transistors.

The level of voltage source VCM is selected to cause proper biasing of first and second transistors 62 and 82 while crowbar switches 58 and 78 are closed. As is well known, proper biasing of source follower transistors is required to ensure that the transistors operate in a linear operation region.

Figure 4:
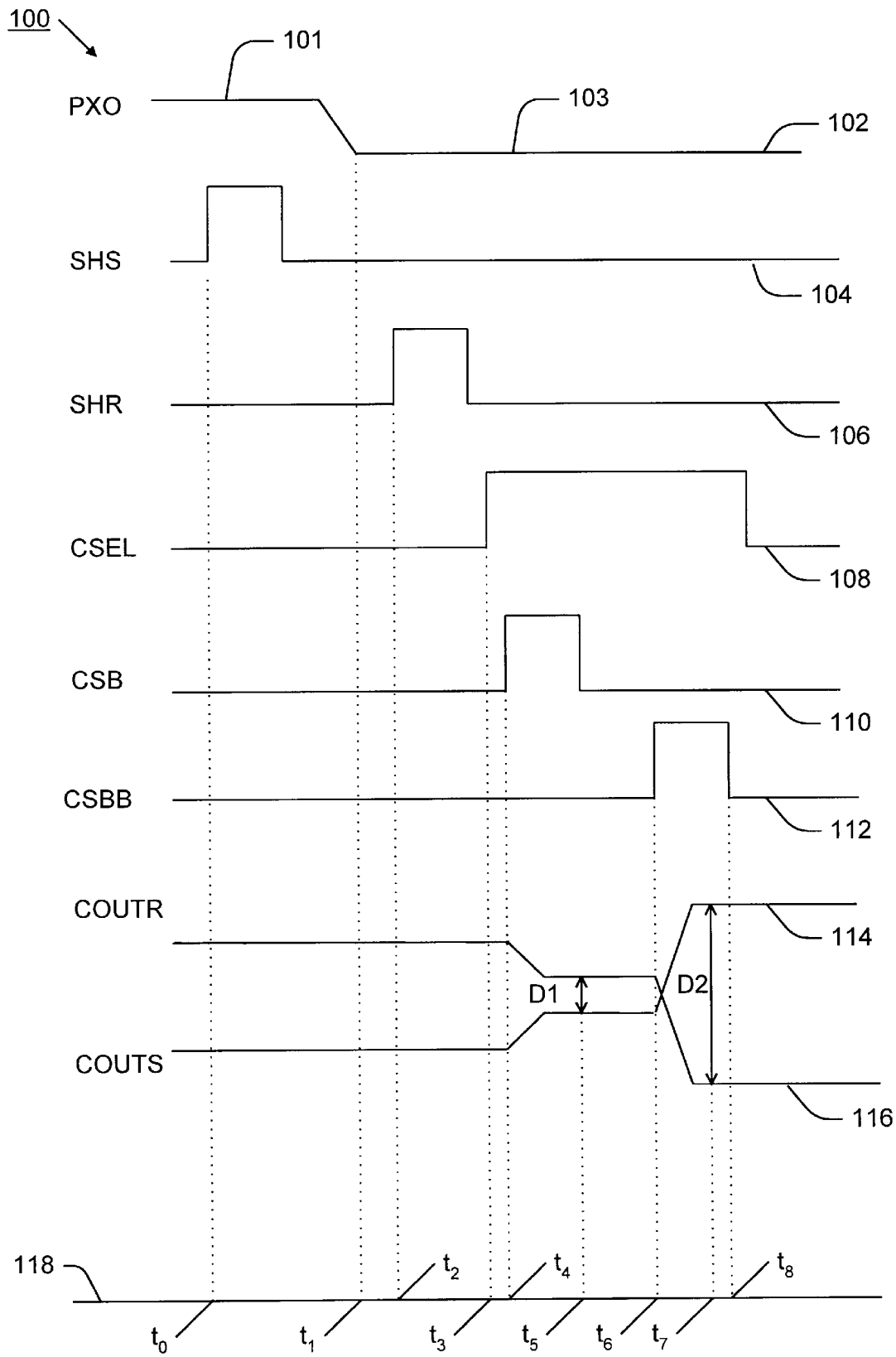
FIG. 4 is a timing diagram illustrating operation of the readout circuit of FIG. 3.

FIG. 4 shows a timing diagram illustrating the timing of control signals for operation of the readout circuit 22 depicted in FIG. 3. The diagram includes a wave form 102 representing a pixel output signal PXO as might be provided at the output of a pixel unit cell 14 (FIG'S 1 and 2). Wave form 102 varies between a light dependent image signal level 101 and a reset reference level 103. Wave form 104 represents the image control signal SHS (FIG. 3), wave form 106 represents the reset control signal SHR, wave form 108 represents the column select signal CSEL (FIG. 3), wave form 110 represents the crowbar control signal CSB, and wave form 112 represents the isolation control signal CSBB. A wave form 114 representing reset reference output signal COUTR (FIG. 3) and a wave form 116 represents the image output signal COUTS (FIG. 3). Signals COUTR, COUTS (FIG. 3) are analog signals. Timing diagram 100 also includes a time line 118. Operation of readout circuit 50 (FIG. 3) is illustrated by timing diagram 100.

In operation, at a time, $t_0$, wave form 104, the sample and hold control signal SHS, steps to a HIGH state while wave form 102 is at the image signal level. At this time, image signal switch 52 (FIG. 3) is turned ON in response to the signal SHS. Meanwhile, wave forms 110 and 112 which represent crowbar control signal CSB and isolation control signal CSBB remain LOW so that switches 56 and 58 (FIG. 3) are OFF. Therefore, at time, $t_0$, image signal capacitor 54 begins storing charge transmitted by the image signal and continues to do so until wave form 104 steps to a LOW state thereby turning image signal switch 52 OFF.

At a subsequent time, $t_1$, wave form 102 drops to the reset reference level 103 as a result of reset transistor 38 (FIG. 2) turning ON. At a time, $t_2$, signal SHR (wave form 106) steps to a HIGH state turning ON reset switch 72 while wave form 102 remains at the reference signal level. Meanwhile, wave forms 110 and 112 remain LOW so that switches 76 and 78 (FIG. 3) remain OFF. Therefore, at time, $t_2$, reset capacitor 74 (FIG. 3) begins storing charge transmitted by the reset reference signal and continues to do so until SHR (wave form 106) steps to a LOW state thereby turning reset switch 72 (FIG. 3) OFF.

At time, $t_3$, control signal CSEL (wave form 108) steps to a HIGH state to turn column select switches 64 and 84 (FIG. 3) ON. By turning these switches ON, readout circuit 22 (FIG. 3) is made ready to output relevant data as described below.

At time, $t_4$, CSB wave form 110 steps HIGH thereby turning first and second crowbar switches 58, 78 (FIG. 3) ON clamping gates 60 and 80 of first and second source follower transistors 62, 82 to VCM. Meanwhile, wave form 112 is LOW so that isolating switches 56, 76 (FIG. 3) are OFF. With crowbar switches 58, 78 ON and isolating switches 56, 76 (FIG, 3) OFF, switching means 28 is in the isolation mode causing image signal sample and hold means 26 to be isolated from gate 60 of transistor 62 and reset signal sample and hold means 27 to be isolated from second source follower transistor 82. Note that with isolating switches 56, 76 OFF, charge is not shared between capacitors 54, 74 as crowbar switches 58, 78 are closed thereby conserving the relative amounts of charge in each capacitor. As will be apparent from the following description, this feature allows for multiple nondestructive determinations of the amount of charge stored in each capacitor.

During the period between $t_4$ and $t_5$, fixed pattern noise (FPN) due mainly to threshold voltage variations between source-follower transistors 62, 82 (FIG. 3) may be measured. More specifically, with the gates of source-follower transistors 62, 82 both clamped to VCM (FIG. 3), a measurement of the voltage difference, D1, (between reset reference output signal COUTR and image output signal COUTS) may be made across output terminals 66, 86 by output processing circuit 25. The voltage difference, D1, is proportional to the threshold voltage variations between source-follower transistors 62, 82 and represents the FIN of readout circuit 22.

Relationships 1, 2, and 3, below, are used to determine the voltage, D1. The voltages $V_{outs,\ 1}$ and $V_{outr,\ 1}$ at output terminals, 66 and 86 respectively at time, $t_5$, may be expressed as $$V_{outs,\ 1} = V_{CM} + V_{ths} \qquad (1)$$

$$V_{outr,\ 1} = V_{CM} + V_{thr} \qquad (2)$$

where $V_{ths}$ and $V_{thr}$ are the threshold voltages of source follower transistors 62 and 82 respectively and $V_{CM}$ is the common mode voltage of source VCM. The voltage, D1, is then expressed as $$D1 = V_{out,\ 1} = V_{outr,\ 1} - V_{outs,\ 1} = V_{thr} - V_{ths} = \Delta V_{th} \qquad (3)$$

Following measurements of D1, crowbar switches 58, 78 are turned OFF at $t_5$ and at time, $t_6$, wave form 112 which represents isolation control signal CSBB is asserted so that isolating switches 56, 76 (FIG. 3) are turned ON. With isolating switches 56, 76 (FIG. 3) turned ON and crowbar switches 58, 78 (FIG. 3) OFF, readout circuit 50 is in its coupled mode with image signal sample and hold means 26 coupled to first source follower transistor 62, and reset signal sample and hold means 27 coupled to second source follower transistor 82. These switch conditions provide respective connections between the charged capacitors 56 and 76 and gates 60 and 80 of source follower transistors 62, 82 and charge stored in capacitors 56 and 76 causes the potentials at gates 60 and 80 to change in proportion to the level of the stored charge in capacitors 56 and 76 respectively causing source follower transistors 62, 82 to output signals at output terminals 66 and 86 that are proportional to the amount of charge stored in the capacitors.

At a time, $t_7$, with control signal conditions unchanged, a measurement of the voltage difference, D2, between reset reference output signal COUTR and image output signal COUTS (FIG. 3) may be taken across output terminals 66, 86 by output processing circuit 25. The difference, D2, is proportional to the FPN of readout circuit 22 plus the difference between the image signal and the reset signal.

Relationships 4 and 5, below, express the voltages $V_{outs, 2}$ and $V_{outr, 2}$ at output terminals 66 and 86 (FIG. 3) respectively at time, $t_7$.

$$V_{outs, 2} = V_S + V_{ths} \quad (4)$$

and $$V_{outr, 2} = V_R + V_{thr} \quad (5)$$

The differential voltage, D2, is then expressed according to Relationship 6, below.

$$D2 = V_{out, 2} - V_{outr, 2} - V_{outs, 2} = V_R - V_S + \Delta V_{th} \quad (6)$$

The true difference between the image signal and the reset signal may now be determined by processing circuit 25 by subtracting the measured voltage, D1, from the measured voltage, D2. This process, referred to as delta difference sampling (DDS), is implemented by output processing circuit 25. The difference between the two measurements is the net signal after correction for FPN, as expressed in relationship (7), below.

$$\Delta V_{out} = V_{out, 2} - V_{out, 1} = V_R - V_S = D2 - D1 \quad (7)$$

At time, $t_8$, control signal CSBB (wave form 112) steps LOW so that isolating switches 56, 76 are turned OFF thereby isolating capacitors 54, 74 from source followers 62, 82. By isolating these capacitors from source followers 62, 82 immediately after a measurement is made across output terminals 66, 86 charge is conserved in capacitors 54, 74. It will thus be appreciated that although not illustrated in the timing diagram of FIG. 4, since capacitors 54, 74 are not shorted during the determination of FPN as in prior art readout circuits which do not include isolating switches, the relative amount of charge stored in the two capacitors is conserved and multiple readings may be taken of the difference between the charge stored in capacitors 54, 74 so that a more accurate measurement can be made of the pixel image detected by pixel unit cell 14.

Multiple readings of the difference between the charges stored in capacitors 54, 74 allows for statistical analysis and interpolation to be performed. The ability to make multiple readings allows for greater accuracy and precision in determining the illumination intensity and frequency sensed by the pixel unit cell 14.

Figure 5:
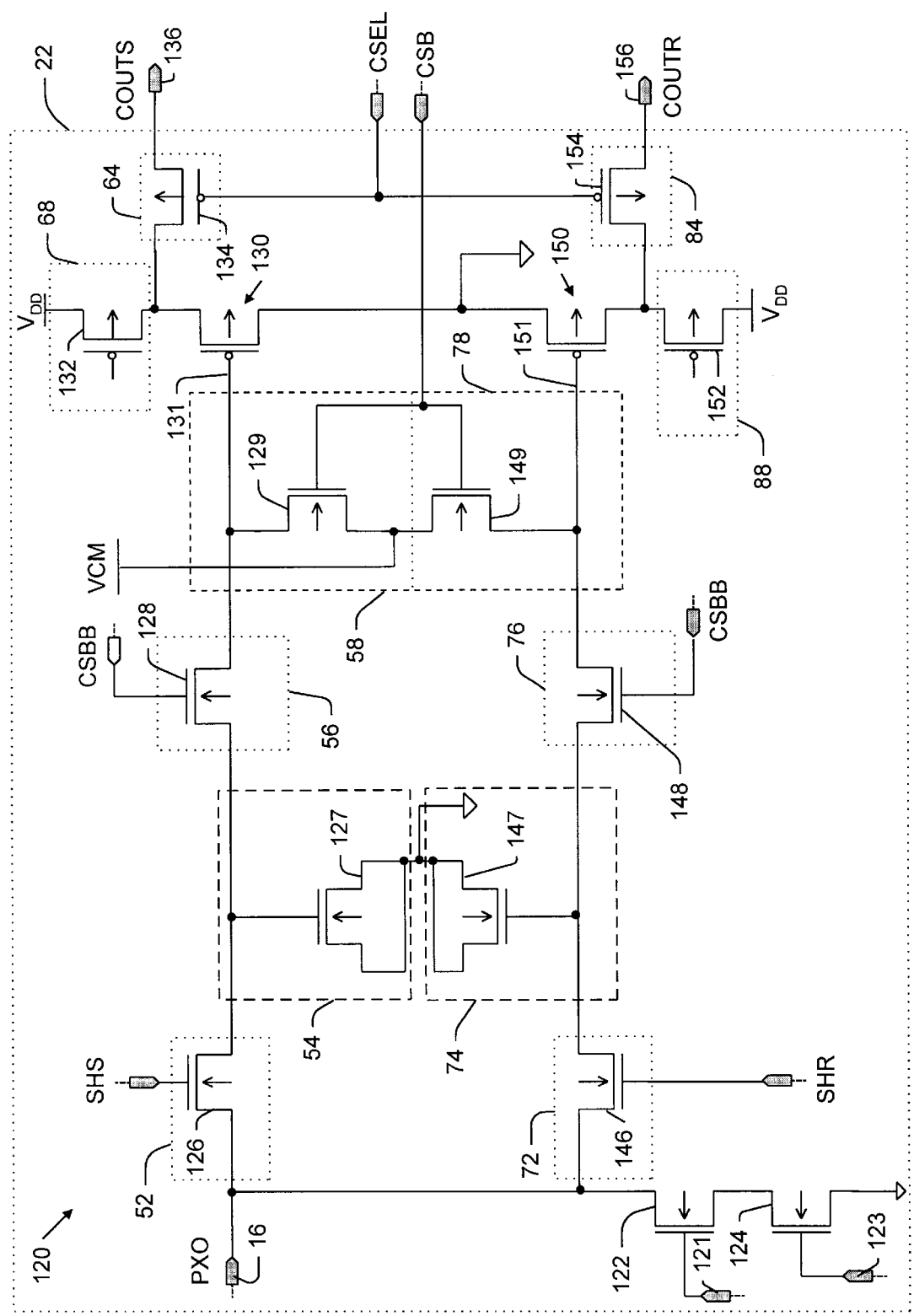
FIG. 5 is a schematic diagram of a specific CMOS implementation of the readout circuit of FIG. 3.

Referring now to FIG. 5, a schematic diagram is presented at 120 depicting the components of an MOS implementation of the readout circuit 22 according to an embodiment of the present invention. The depicted circuit includes a first load transistor 122 and a second load transistor 124 respectively having control inputs 121 and 123 coupled to receive bias signals from analog bias circuit 24 (FIG. 1). Transistor 124 is coupled between ground and the drain of transistor 122. The source 125 of transistor 122 is coupled to column bus 16. Transistors 122,124 are both NMOS transistors and provide a load resistance for in-pixel source follower 42 (FIG. 2). The coupling of these two transistors in series provides an appropriate bias for ensuring that the in-pixel source follower operettas in its linear region.

The readout circuit further includes an image signal transistor 126 having its source coupled to receive the pixel output signal from column bus 16 (FIG. 2). Transistor 126, which implements image signal switch 52 (FIG. 3), has its gate coupled to receive image control signal SHS (FIG. 3) and a drain coupled to a first terminal of image signal capacitor 54. Image signal capacitor 54 is implemented using an NMOS transistor 127 having its drain and source both coupled to ground so that capacitance is provided across the gate and body of the transistor. The drain of transistor 126 is also coupled to the source of a first isolation transistor 128 which implements the first isolating switch 56.

Transistor 128, which is also an NMOS transistor, has its gate coupled to receive isolation control signal CSBB and its drain coupled to the gate 131 of a first source follower transistor 130. Transistor 130, which is a PMOS transistor, has its drain coupled to ground and its source coupled to the source of a first column select transistor 134. A first tail current transistor 132, which is also a PMOS transistor, has its source coupled to VDD. Transistor 132 implements the first current source 68 (FIG. 3) and transistor 134 implements first column select switch 64.

The readout circuit further includes a reset transistor 146 having its source coupled to receive the pixel reset signal from column bus 16 (FIG. 2), its gate coupled to receive reset control signal SHR, and its drain coupled to the source of a second isolation transistor 148. Transistor 146, which is an NMOS transistor, implements reset switch 72 (FIG. 3). The drain of reset transistor 146 is also coupled to a first terminal of reset capacitor 74. Reset capacitor 74 is implemented using an NMOS transistor 147 having its drain and source both coupled to ground so that capacitance is provided across the gate and body of the transistor.

Transistor 148 is an NMOS transistor which implements a second isolating switch 76 (FIG. 3). Transistor 148 includes a gate, coupled to receive isolation control signal CSBB, and a drain coupled to the gate 151 of a second source follower transistor 150. Transistor 150, which is a PMOS transistor, has its drain coupled to ground and its source coupled to the source of a second column select transistor 154. A second tail current transistor 152, which is a PMOS transistor, has its source coupled to VDD and its drain coupled to the source of the second column select transistor 154. Transistor 152 implements current source 88 (FIG. 3).

The readout circuit may also be implemented using NMOS transistors for the first and second source followers according to well known methods. Control signals applied to CMOS readout circuit 120 have wave forms as illustrated in timing diagram 100 (FIG. 4).

Figure 6:
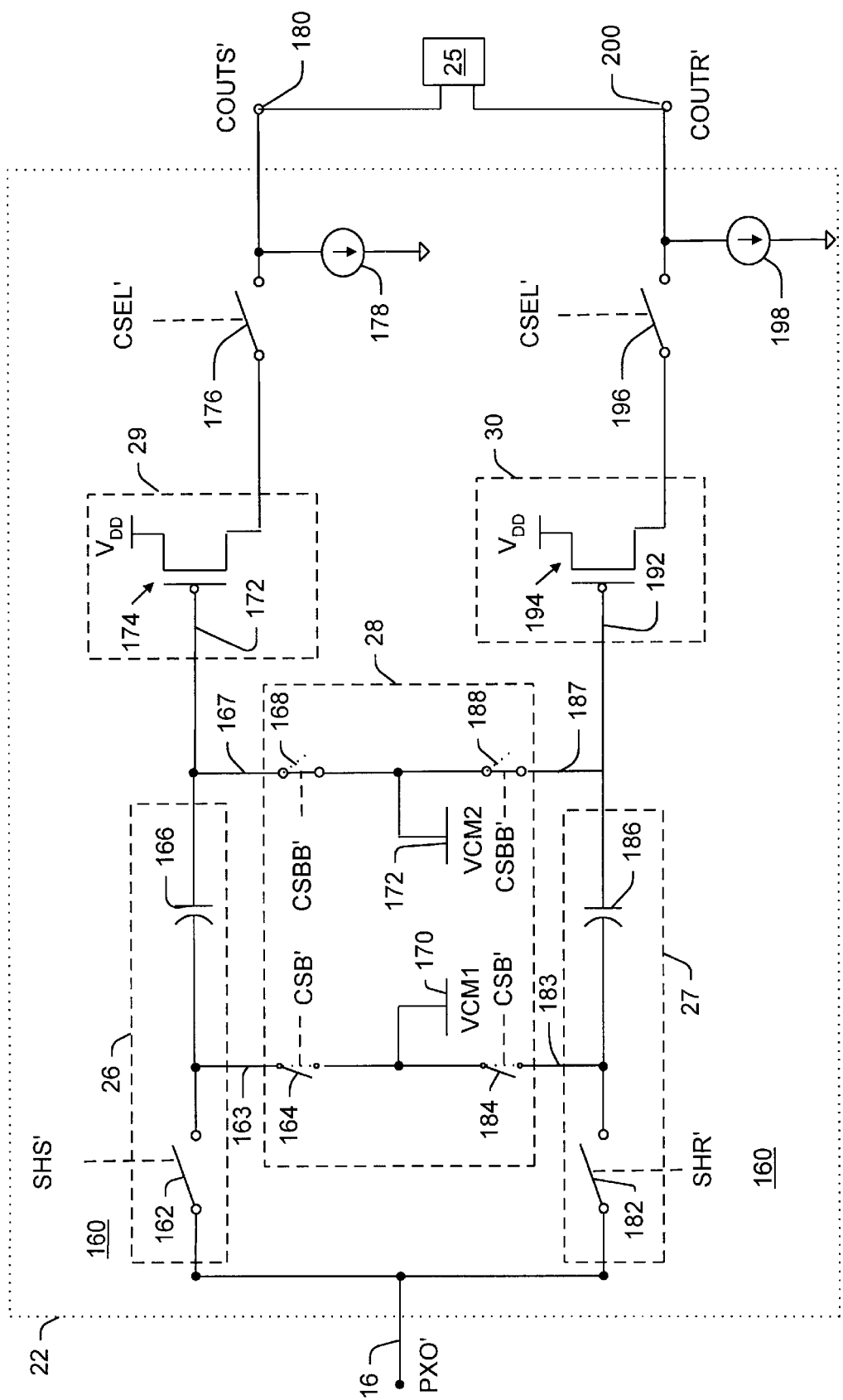
FIG. 6 is a schematic diagram depicting in general a readout circuit according to a second embodiment of the present invention.

FIG. 6 is a schematic diagram of a readout circuit 22 according to a second embodiment of the present invention. As in the previous embodiment, the readout circuit shown generally at 160 may be used to implement each of the column readout circuits 22 (FIG. 1) of APS structure 10. In this embodiment, the first sample and hold circuit 26 is implemented by a switch 162 and a capacitor 166 connected in series. The image signal switch 162 includes: a first terminal coupled to receive pixel output signal PXO from a pixel unit cell 14 (FIG. 1) via a column bus 16; a control input coupled to receive an image signal control signal SHS' from timing control means 23 (FIG. 1); and a second terminal coupled to a first terminal 163 of a switching means 28 including four switches 164, 168, 184 and 188.

A first terminal of switch 164 is connected to the terminal 163. A control input of switch 164 is coupled to receive an isolation control signal CSB' from timing control circuit 23 (FIG. 1). A second terminal of switch 164 is coupled to a first common mode voltage source VCM1.

Capacitor 166 includes a second terminal which is coupled to a second terminal 167 of switching means 28 leading to a first terminal of a first crowbar switch 168 which has a second terminal coupled to a second common mode voltage source VCM2. A control input to switch 168 is coupled to receive a crowbar control signal CSBB' from timing control circuit 23 (FIG. 1). The first terminal of switch 168 and the second terminal of capacitor 166 are also coupled to the gate 172 of a first source follower transistor 174 which implements image amplifier 29.

Transistor 174 includes a source coupled to VDD and a drain coupled to a first terminal of a first column select switch 176 which has its control input coupled to receive a column select signal CSEL' from the output of timing control circuit 23 (FIG. 1), and a second terminal coupled to an image output terminal 180 at which image output signal COUTS' is developed.

A first current source 178 is coupled between output terminal 180 and ground. In this embodiment of the present invention, source 178 is also included within analog bias circuit 31 (FIG. 1) and provides a bias current to output terminal 180 of each of the m readout circuits 22.

Readout circuit 160 further includes a second sample and hold circuit 27 comprised of a reset switch 182 and capacitor 186. Reset switch 182 has a first terminal coupled to receive the pixel unit reset signal via column bus 16, a control input coupled to receive a reset control signal SHR' from timing control means 23 (FIG. 1), and a second terminal coupled to a third terminal 183 of switching means 28 and to one side of the story capacitor 186. Terminal 183 is connected to a first terminal of a second isolating switch 184 having a control input coupled to receive an isolation control signal CSB' from the output of timing control means 23. Switch 184 further includes a second terminal coupled to first common mode voltage source VCM1.

The other side of capacitor 186 is coupled to a fourth terminal 187 common to a first terminal of a second crowbar switch 188 having a second terminal coupled to second common mode voltage source VCM2. A control input of switch 188 is coupled to receive crowbar clamping control signal CSBB' from timing control circuit 23 (FIG. 1).

The first terminal of switch 188 and the second terminal of capacitor 186 are also coupled to the gate 192 of a second source follower transistor 194 which implements reset amplifier 30. Transistor 194 includes a source coupled to VDD and a drain coupled to a first terminal of a second column select switch 196. Switch 196 includes a control input which is coupled to receive a column select signal CSEL' from timing control circuit 23, and a second terminal coupled to a reset output terminal 200 at which a reset output signal COUTR' is developed.

A second current source 198 is coupled between output terminal 200 and ground. Current source 198 is likewise included within analog bias circuit 24 (FIG. 1) and provides a bias current to the reset output terminal 200 of each of the m of readout circuits 22 in APS structure 10 (FIG. 1).

Figure 7:
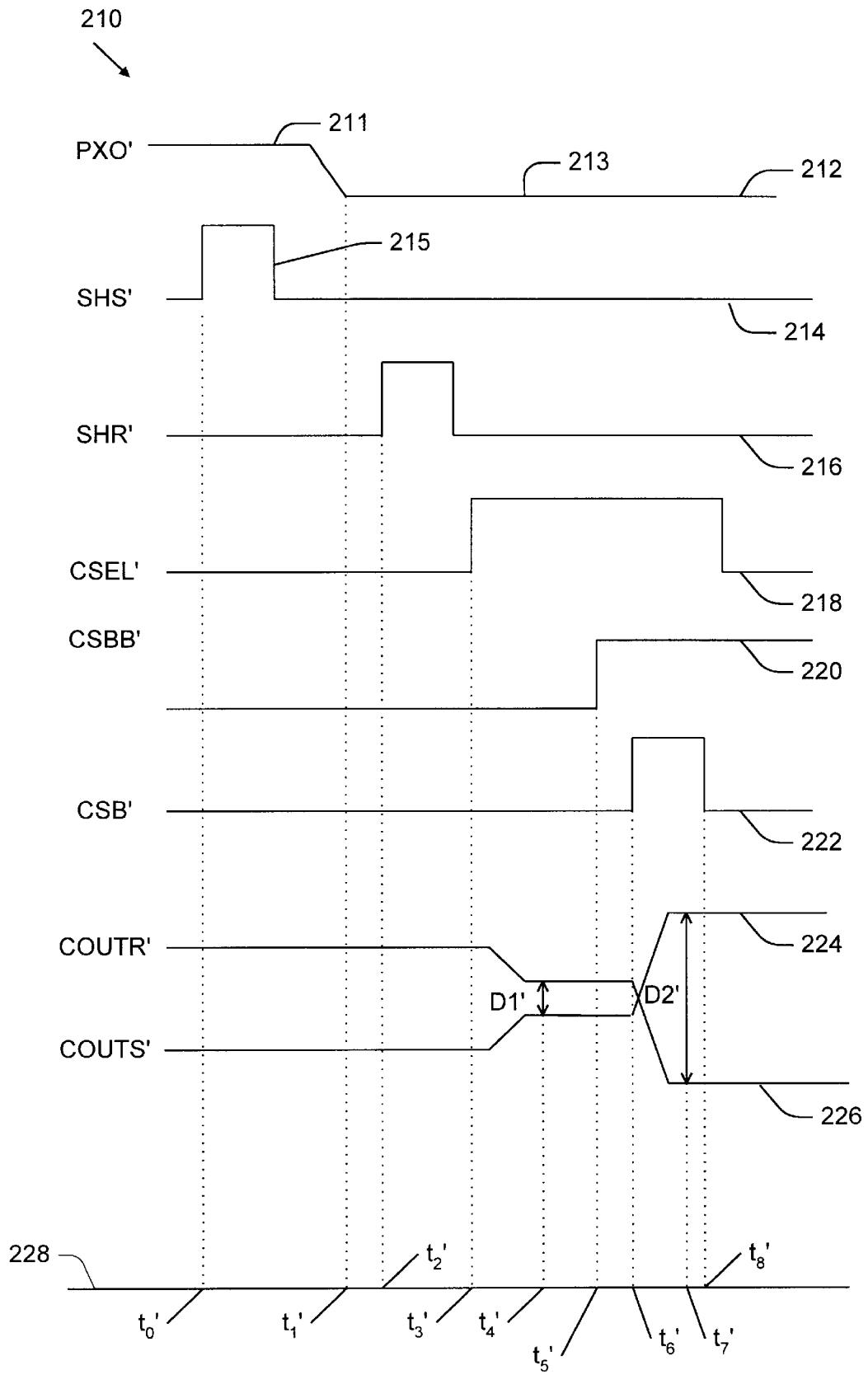
FIG. 7 is a timing diagram illustrating operation of the readout circuit of FIG. 6.

Referring now to FIG. 7, a timing diagram is presented at 210 illustrating the timing of control signals for operation of the readout circuit 160. Timing diagram 210 includes a wave form 212 representing the pixel output signal PXO' and includes two signal levels; an image signal level 211 and a reset reference level 213. Timing diagram 210 also includes a wave form 214 representing image control signal SHS', a wave form 216 representing reset control signal SHR', a wave form 218 representing column select signal CSEL', a wave form 220 representing crowbar control signal CSBB', and a wave form 222 representing isolation control signal CSB'. Timing diagram 210 further includes a wave form 224 representing reset reference output signal COUTR', a wave form 222 representing image output signal COUTS' and a time line 228.

At a time, $t_0'$, wave form 214 (SHS') steps to a HIGH state while wave form 212 is at an image signal level. This causes switch 162 (FIG. 6) to turn ON. Meanwhile, wave form 222 is LOW causing switches 164, 184 to be OFF, while wave form 220 is low causing switches 168, 188 to be ON. At this time, the terminals 237, 257 of capacitors 166, 186 are held to VCM2. Therefore, during the time that SHS' is HIGH image signal capacitor 166 will store charge from the pixel output signal PXO' and continue to do so until wave form 214 steps to a LOW state at 215 thereby turning image signal switch 162 OFF.

At a time, $t_1'$, wave form 212 drops to the reset reference level as a result of reset transistor 38 (FIG. 2) being turned on. At time, $t_2'$, wave form 216 steps to a HIGH state causing reset switch 182 to be turned ON. Meanwhile, wave form 220 which represents crowbar control signal CSBB' remains LOW so that switches 168, 188 remain ON. Therefore, at time, $t_2'$, reset capacitor 182 will begin storing reset charge from bus 16 and will continue to do so until wave form 216 steps to a LOW state thereby turning reset switch 186 OFF. At this point capacitor 236 is charged to the pixel data level and capacitor 256 is charged to the reset reference level.

At a time, $t_3'$, CSEL' (wave form 218) steps HIGH to turn column select switches 176 and 196 ON. By turning these switches ON, readout circuit 22 is made ready to output data via output terminals 180, 200. However, since switches 164, 184 remain OFF while switches 168, 188 remain ON, switching means 28 is in an isolation mode. With switches 164, 184 OFF and switches 168, 188 ON, the first terminals of capacitors 166 and 186 are floating while the second terminals of capacitors 166,186 are respectively coupled to gates 172, 192 transistors 174,194 but gates 172, 192 are also coupled to VCM2. Therefore, image signal sampling means 26 (FIG. 6) and reset signal sampling means 27 (FIG. 6) are operatively decoupled from image signal amplifier 29 and reset signal amplifier 30.

But since the gates of transistors 174 and 194 are tied to VCM2 by the crowbar switches 168 and 188 at a time, $t_4'$, fixed pattern noise (FPN) can be measured. FIN is due mainly to threshold voltage variations between source-follower transistors 174, 194. The measurement is taken by output processing circuit 25, across output terminals 180 and 200 and between reset reference output signal (COUTR') 224 and image output signal COUTS'. The difference, D1' between these voltage signals is proportional to the threshold voltage variations between source-follower transistors 174, 194 and is thus proportional to the FPN of the circuit.

The voltages $V_{outs1}$, and $V_{outr1}$, at output terminals, 180 and 200 respectively at time, $t_4'$ can be expressed as $$V_{outs,\,1} = V_{CM2} - V_{ths} \tag{8}$$

$$V_{outr,\,1} = V_{CM2} - V_{thr} \tag{9}$$

where $V_{ths}$ and $V_{thr}$ are the threshold voltages of source follower transistors 174 and 194 respectively, and $V_{CM2}$ is the voltage of the common mode voltage source VCM2. The voltage, D1', is then expressed as;

$$D1' = V_{out,\,1} = V_{outr,\,1} - V_{outs,\,1} = V_{ths} - V_{thr} = -\Delta V_{th} \tag{10}$$

At time, $t_5'$, wave form 220, which represents crowbar control signal CSBB' steps HIGH thereby turning crowbar switches 168, 188 OFF and at a subsequent time, $t_6'$, wave form 222, which represents isolation control signal CSB', steps HIGH so that isolation switches 164, 184 are turned ON. This causes the first terminals of capacitors 166 and 186 to be clamped to VCM1. Since the second terminals of capacitors 166 and 186 are still coupled to gates 172 and 192 of source follower transistors 174 and 194, the charge stored in capacitors 166 and 186 will cause the potentials at gates 172 and 192 to rise to values proportional to the respective charge values stored in the capacitors 166 and 186. The change in the potentials applied at gates 172 and 192 cause source follower transistors 174 and 194 to develop voltages at outputs 180 and 200 which are proportional to the respective amounts of charge stored in capacitors 166 and 186.

Accordingly, at a time, $t_7'$, a measurement of the difference, D2', between reset reference output signal COUTR', represented by wave form 224, and image output signal COUTS', represented by wave form 222 can be made across the output terminals. This measuring process is implemented by processing circuit 25. The difference, D2', between the two voltages is proportional to the FIN of readout circuit 160 plus the difference between the image signal and the reset reference signal. The difference between the image signal and the reset reference signal can thus be determined by subtracting the measured quantity, D1', from the measured voltage, D2'. This process, referred to as delta difference sampling (DDS), is also implemented by output processing circuit 25 (FIG. 1).

Assuming that the voltage at the gates of source follower transistors 174, 194 become Vgs and Vgr, the charge on capacitors 166, 186 may be exposed as $C_S(V_{CM1}-Vgs)$ and $C_R(V_{CM1}-Vgr)$ respectively. Charge conservation is expressed according to relationships 11 and 12, below.

$$C_S(V_S-V_{CM2})=C_S(V_{CM1}-Vgs) \qquad (11)$$

and $$C_R(V_R-V_{CM2})=C_R(V_{CM1}-Vgr) \qquad (12)$$

from which the voltages at output terminals 180, 200 are derived;

$$V_{outs,\,2}=Vgs-V_{ths}=V_{CM1}+V_{CM2}-V_S-V_{ths} \qquad (13)$$

$$V_{outr,\,2}=Vgr-V_{thr}=V_{CM1}+V_{CM2}-V_R-V_{thr} \qquad (14)$$

The new differential voltage, D2', measured across terminals 180, 200 (FIG. 6) includes the actual signal and the FPN as expressed in Relationship (15), below;

$$D2'=V_{out,\,2}=V_S-V_R-\Delta V_{th} \qquad (15)$$

The difference between the two voltage measurements, D1' and D2' is proportional to the net signal after the FPN voltage is corrected. This difference is expressed in Relationship 16, below.

$$\Delta V_{out}=V_{out,\,2}-V_{out,\,1}=V_S-V_R \qquad (16)$$

At a time, t8', isolation control signal CSBB', represented by wave form 222, steps LOW so that isolating switches 164, 184 are turned OFF thereby operatively decoupling capacitors 166, 186 from source followers 174, 194 by floating the first terminals of capacitors 166, 186. By operatively decoupling capacitors 166, 186 from source followers 174, 194 immediately after a measurement is made across output terminals 180, 200 at time, $t_7'$, charge is conserved in capacitors 166, 186 (FIG. 6).

Figure 8:
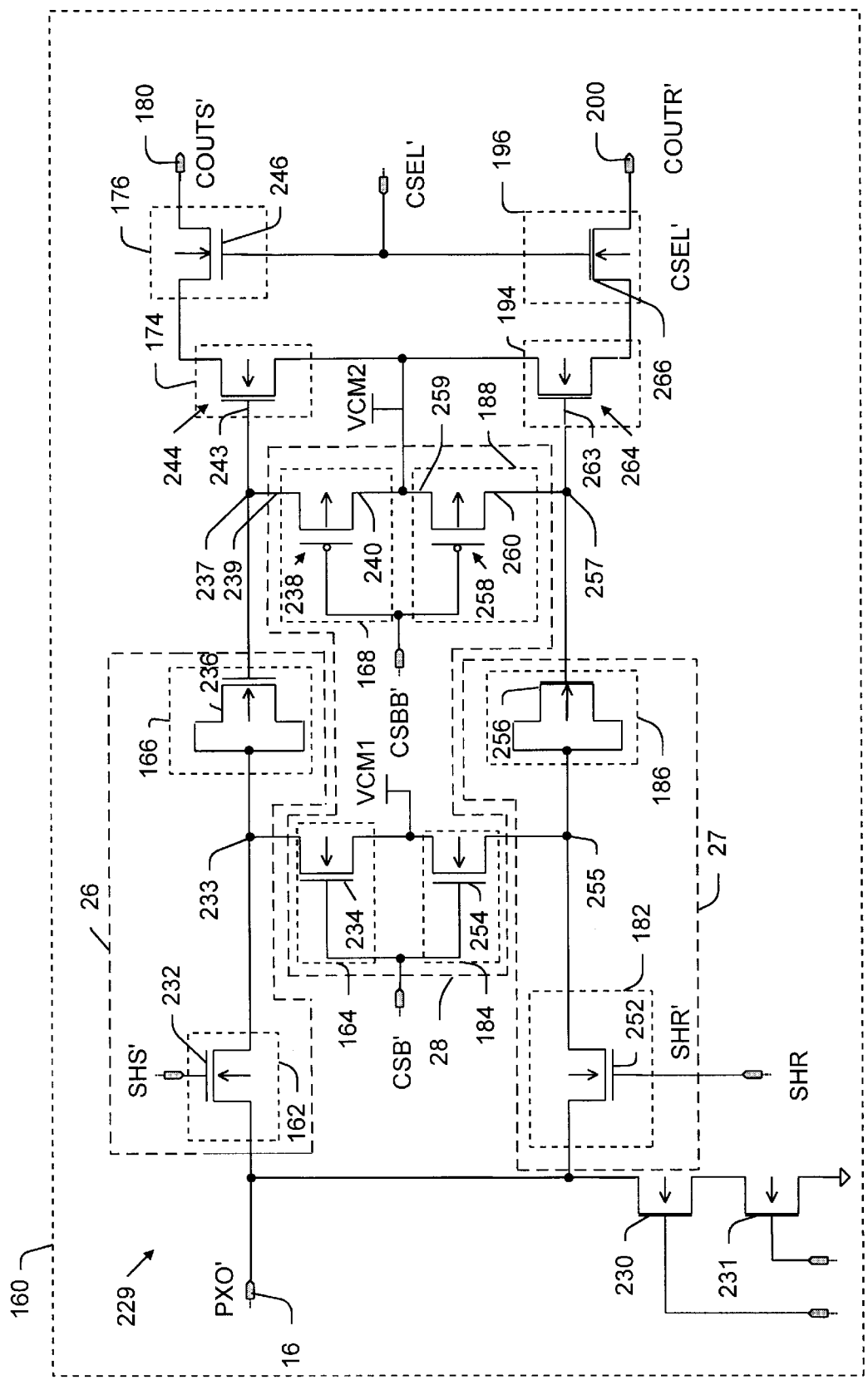
FIG. 8 is a schematic diagram of a specific CMOS implementation of the readout circuit of FIG. 6.

FIG. 8 shows a schematic diagram at 229 of an exemplary CMOS readout circuit 22 according to this second embodiment of the present invention. The readout circuit at 229 includes a first load transistor 230 and a second load transistor 231 each including a control input coupled to receive a bias signal from analog bias circuit 24 (FIG. 1). Transistors 230 and 231 are both NMOS transistors. Transistor 231 is coupled between ground and that drain of transistor 230. The source of transistor 230 is coupled to column bus 16. Transistors 230, 231 provide a load impedance for in-pixel source follower 42 of pixel unit cell 14 (FIG. 2) that insures that source follower 42 operates in a linear region.

The readout circuit of FIG. 8 includes an image signal transistor 232 having its source coupled to receive pixel output signal PXO' from column bus 16 and implements the switch 162. Its gate is coupled to receive image control signal SHS', and its drain is coupled via a node 233 to the drain of a first isolation transistor 234 which implements isolating switch 164. The gate of transistor 234 is coupled to receive isolation control signal CSB', and its source is connected to first common mode voltage source VCM1. The drain of transistor 232 is also coupled to a first terminal of image signal capacitor 166 which is implemented by an NMOS transistor 236 having its drain and source both coupled to node 233. The drain and source of transistor 236 serve as a first plate of capacitor 166 while the gate serves as a second plate of the capacitor.

The gate of transistor 236 is coupled via a second node 237 to the drain 239 of a transistor 238 which implements first crowbar switch 168. The source 240 of transistor 238 is coupled to VCM2 and the gate thereof is coupled to receive crowbar control signal CSBB'. The drain 239 of transistor 238 and the gate of transistor 236 are also coupled via node 237 to the gate 243 of a first transistor 244 that implements source follower 174.

The source of transistor 244 is coupled to VCM2 and its drain coupled to the source of a first column select transistor 246. Transistor 246 includes a gate coupled to receive column select signal CSEL' and a drain coupled to an image output terminal 180 upon which is developed on image output signal COUTS'.

The readout circuit further includes a reset transistor 252 having its source coupled to column bus 16 to receive pixel reference signal, its gate coupled to receive reset control signal SHR', and its drain coupled via node 255 to the drain of a transistor 254 which implements isolation switch 184. Transistor 254 has its gate coupled to receive isolation control signal CSB', and its drain coupled to VCM1. The drain of reset transistor 252 is also coupled via node 255 to one side of a reset capacitor 186 that is implemented by an NMOS transistor 256 having its drain and source both coupled to the drain of transistor 252. The channel between the drain and source of transistor 256 serves as a first plate of capacitor 186 while the gate of the transistor serves as a second plate of the capacitor. The gate of capacitor 256 is coupled via a node 257 to the drain 260 of a transistor 258 which implements switch 188. Transistor 258 also includes a source 259 that is coupled to VCM2. The gate of transistor 258 is coupled to receive crowbar control signal CSBB'. The drain 260 of transistor 258 and the gate of transistor 256 are also coupled via node 257 to the gate of a transistor 264 which implements switch 194 and includes a source coupled to VCM2 and a drain coupled to the source of a second column select transistor 266. The gate of transistor 266 is coupled to receive column select signal CSEL'. The drain of transistor 266 is coupled to reset output terminal 200 upon which the image output signal COUTR' is developed. Control signals applied to the readout circuit 229 have wave forms as illustrated in timing diagram 210 (FIG. 7).

While the invention has been particularly shown and described with reference to certain preferred embodiments, it will be understood by those skilled in the art that various alterations and modifications in form and detail may be made therein. Accordingly, it is intended that the following claims cover all such alterations and modifications as fall within the true spirit and scope of the invention.

What I claim is:

1. In an active pixel sensing structure including an array of pixel unit cells adapted to alternate between a light sensing mode wherein said cells output image signals and a reset mode wherein said cells output reset signals, said image signals being proportional to light incident on corresponding cells and said reset signals being proportional to a predefined reference potential, said structure further including readout circuit means connected to signal lines for reading out signals from said cells, an improved readout circuit means comprising:

first sample and hold means for receiving and storing an image signal developed on said signal lines;

second sample and hold means for receiving and storing a reset signal developed on said signal lines;

first signal amplifying means having a first input terminal and a first output terminal;

second signal amplifying means having a second input terminal and a second output terminal; and switching means operable between a first mode wherein said first sample and hold means is coupled to said first input terminal and said second sample and hold means is coupled to said second input terminal, and a second mode wherein said first sample and hold means is operatively decoupled from said first input terminal, said second sample and hold means is operatively decoupled from said second input terminal, and said first and second input terminals are connected to a source of predetermined potential;

whereby with said switching means in said second mode, a voltage, D1, taken across said first and second output terminals is proportional to the fixed pattern noise voltage attributable to said first and second amplifying means; and whereby with said switching means in said first mode, a voltage, D2, taken across said first and second output terminals is proportional to a voltage equal to the difference between said image signal and said reset signal plus said voltage, D1, such that by subtracting said voltage, D1, from said voltage, D2, a signal proportional to the actual light detected by a particular cell can be obtained.

2. In an active pixel sensing structure as recited in claim 1 wherein:

said first sample and hold means includes,
  a first sampling switch having a first terminal coupled to receive said image signal, and a second terminal, and
  a first capacitor having a third terminal coupled to said second terminal, and a fourth terminal coupled to a circuit ground; and wherein said second sample and hold means includes,
  a second sampling switch having a fifth terminal coupled to receive said reset signal, and a sixth terminal, and
  a second capacitor having a seventh terminal coupled to said sixth terminal and an eighth terminal coupled to said circuit ground.

3. In an active pixel sensing structure as recited in claim 2 wherein said first and second capacitors are implemented using the gate and body of an MOS transistor as spaced apart capacitor plates.

4. In an active pixel sensing structure as recited in claim 2 wherein said first and second capacitors are implemented by spaced apart conductive plates.

5. In an active pixel sensing structure as recited in claim 2 wherein said switching means includes:

a first isolating switch having a ninth terminal coupled to receive said signal from said first sample and hold means, and a tenth terminal coupled to said first input terminal;

a first crowbar switch having an eleventh terminal coupled to said first input terminal, and a twelfth terminal coupled to receive said predefined potential;

a second isolating switch having a thirteenth terminal coupled to receive an image signal from said second sample and hold means, and a fourteenth terminal coupled to said second input terminal; and a second crowbar switch having a fifteenth terminal coupled to said second input terminal, and a sixteenth terminal coupled to receive said predefined potential;

wherein while said switching means is in said first mode, said first and second isolating switches are closed to couple said first and second sample and hold means to said first and second input terminals and said first and second crowbar switches are open so that said voltage, D2, can be measured across said first and second output terminals; and wherein while said switching means is in said second mode, said first and second crowbar switches are closed to couple said first and second input terminals to receive said predefined voltage source, and said first and second isolating switches are open to decouple said first and second sample and hold means from said first and second input terminals thereby conserving charge stored in said first and second sample and hold means.

6. In an active pixel sensing structure as recited in claim 5 wherein said first and second isolating switches and said first and second crowbar switches are implemented by NMOS transistors and wherein said first and second amplifier amplifying means are implemented by PMOS source follower transistors.

7. In an active pixel sensing structure as recited in claim 1 and further comprising:

a first selector switch for selectively connecting said first output terminal to a first input of a signal processing circuit; and a second selector switch for selectively connecting said second output terminal to a second input of said signal processing circuit, said first and second switching means being simultaneously controlled by an output select signal.

8. In an active pixel sensing structure as recited in claim 1 wherein:

said first sample and hold means includes,
  a first sampling switch having a first terminal coupled to receive said image signal, and a second terminal, and
  a first capacitor having a third terminal coupled to said second terminal and a fourth terminal coupled to said first input terminal; and said second sample and hold means comprises,
  a second sampling switch having a fifth terminal coupled to receive said reset signal, and a sixth terminal, and a second capacitor having a seventh terminal coupled to said sixth terminal and an eighth terminal coupled to said second input terminal.

9. In an active pixel sensing structure as recited in claim 8 wherein said first and second capacitors are implemented using the gate and body of an MOS transistor as spaced apart capacitor plates.

10. In an active pixel sensing structure as recited in claim 8 wherein each of said first and second capacitors is implemented by spaced apart conductive plates.

11. In an active pixel sensing structure as recited in claim 1 wherein said switching means includes:

a first isolating switch having a first terminal coupled to said first sample and hold means, and a second terminal coupled to said first input terminal;

a second isolating switch having a third terminal coupled to said second sample and hold means, and a fourth terminal coupled to said second input terminal;

a first crowbar switch having a fifth terminal coupled to said second terminal and to said first input terminal, and a sixth terminal coupled to a source of predetermined potential; and a second crowbar switch having a seventh terminal coupled to said second sample and hold means and to said second input terminal, and an eighth terminal coupled to said source of predetermined potential;

wherein while said switching means is in said first mode, said first and second crowbar switches are open and said first and second isolating switches are closed in order to determine said voltage, D2, across said first and second output terminals; and wherein while said switching means is in said second mode, said first and second isolating switches are open and said first and second crowbar switches are closed to clamp said first and second input terminals to said source of predetermined voltage in order to determine said voltage, D1, across said first and second output terminals.

12. In an active pixel sensing structure as recited in claim 11 wherein said first and second isolating switches are implemented by NMOS transistors, said first and second crowbar switches are implemented by PMOS transistors, and said first and second amplifying means are implemented by NMOS source follower transistors.

13. In an active pixel sensing structure as recited in claim 1 wherein each of said first and second signal amplifying means includes a source follower MOS transistor.

14. In an active pixel sensing structure as recited in claim 8 further comprising:

a first column select switch for selectively coupling said first output terminal to an output signal processing means; and a second column select switch for selectively coupling said second output terminal to said output signal processing means and wherein said output signal processing means performs said function of subtracting said voltage, D1, from said voltage, D2.

15. In an active pixel sensing structure as recited in claim 14 wherein said column select switches are implemented by MOS transistors.

16. In an active pixel sensing structure as recited in claim 1 wherein at least some of said pixel unit cells include a p-n junction photodiode.

17. In an active pixel sensing structure as recited in claim 1 wherein at least some of said pixel unit cells comprise:

a photosensing structure having a sensing node;

a reset switch for periodically resetting said sensing node to a reference voltage; and an in-pixel source follower for amplifying a signal transmitted from said sensing node.

18. A method of reading out signals from the cells of an active pixel sensing structure including an array of pixel unit cells adapted to alternate between a light sensing mode wherein each said cell outputs an image signal, and a reset mode wherein each said cell outputs a reset signal, the image signals being proportional to light incident on corresponding cells and the reset signals being proportional to a predetermined reference potential, said method comprising the steps of sampling and holding an image signal generated by a particular cell; sampling and holding a reset signal generated by said particular cell;

providing a first signal amplifying means having a first input terminal and a first output terminal;

providing a second signal amplifying means having a second input terminal and a second output terminal;

providing a switching means operable between a first mode wherein said image signal is coupled to said first input terminal and said reset signal is coupled to said second input terminal, and a second mode wherein said image signal is operatively decoupled from said first input terminal and said reset signal is operatively decoupled from said second input terminal, and said first and second input terminals are coupled to a predefined potential;

determining a voltage, D1, across said first and second output terminals with said switching means in said second mode, said voltage, D1, being proportional to a fixed pattern noise voltage attributable to said first and second amplifying means;

determining a voltage, D2, across said first and second output terminals with said switching means in said first mode wherein said voltage, D2, is proportional to a voltage equal to the difference between said image signal and said reset signal plus said fixed pattern noise voltage; and subtracting said voltage, D1, from said voltage, D2, to determine a signal proportional to the light detected by said particular cell.

* * * * *